(12) United States Patent
Edelhauser

(10) Patent No.: US 12,196,798 B2
(45) Date of Patent: Jan. 14, 2025

(54) MONITORING CIRCUIT FOR AN INTERLOCK SYSTEM, INTERLOCK SYSTEM, ASSEMBLY HAVING AN INTERLOCK SYSTEM AND HAVING A FUNCTIONAL UNIT, AND METHOD FOR OPERATING AN INTERLOCK SYSTEM

(71) Applicant: Valeo Siemens eAutomotive Germany GmbH, Erlangen (DE)

(72) Inventor: Rainer Edelhauser, Nuremberg (DE)

(73) Assignee: Valeo Siemens eAutomotive Germany GmbH, Erlangen (DE)

( * ) Notice: Subject to any disclaimer, the term of this patent is extended or adjusted under 35 U.S.C. 154(b) by 292 days.

(21) Appl. No.: 17/297,903

(22) PCT Filed: Nov. 22, 2019

(86) PCT No.: PCT/EP2019/082266
§ 371 (c)(1),
(2) Date: May 27, 2021

(87) PCT Pub. No.: WO2020/109169
PCT Pub. Date: Jun. 4, 2020

(65) Prior Publication Data
US 2022/0043045 A1 Feb. 10, 2022

(30) Foreign Application Priority Data
Nov. 30, 2018 (DE) ............ 10 2018 130 575.3

(51) Int. Cl.
*G01R 31/00* (2006.01)
*B60L 3/00* (2019.01)
*G01R 35/00* (2006.01)

(52) U.S. Cl.
CPC .......... *G01R 31/006* (2013.01); *B60L 3/0046* (2013.01); *G01R 35/00* (2013.01)

(58) Field of Classification Search
CPC ............ G01R 31/08–11; G01R 31/006; G01R 31/007; G01R 31/005; G01R 31/008
See application file for complete search history.

(56) References Cited

U.S. PATENT DOCUMENTS 5,461,370 A * 10/1995 Igarashi ............... G08B 26/005
340/2.7
5,537,283 A * 7/1996 Keese .................. H01H 47/001
361/49

(Continued)

FOREIGN PATENT DOCUMENTS

CN 202632102 U * 12/2012
CN 104377684 A 2/2015

(Continued)

OTHER PUBLICATIONS

German Search Report issued in corresponding German Application No. 10 2018 130 575.3, dated Feb. 14, 2020 (4 pages).

(Continued)

*Primary Examiner* — Lee E Rodak
*Assistant Examiner* — Demetrius R Pretlow
(74) *Attorney, Agent, or Firm* — Osha Bergman Watanabe & Burton LLP

(57) ABSTRACT

A monitoring circuit (2) for an interlock system (1), said interlock system comprising a first monitoring line (3), a second monitoring line (4), and at least one line bridge (5), by means of which the monitoring lines (3, 4) are electrically conductively connected in a closed state of the interlock system (1), said monitoring circuit comprising a signal generation device (11) which is configured for generating a monitoring signal for the first monitoring line (3) which alternates between a first monitoring voltage and a second monitoring voltage and which is referenced to a reference potential, and a signal evaluation device (17) by means of which a voltage profile (43, 48 to 51) which is referenced to (Continued)

Figure 1:
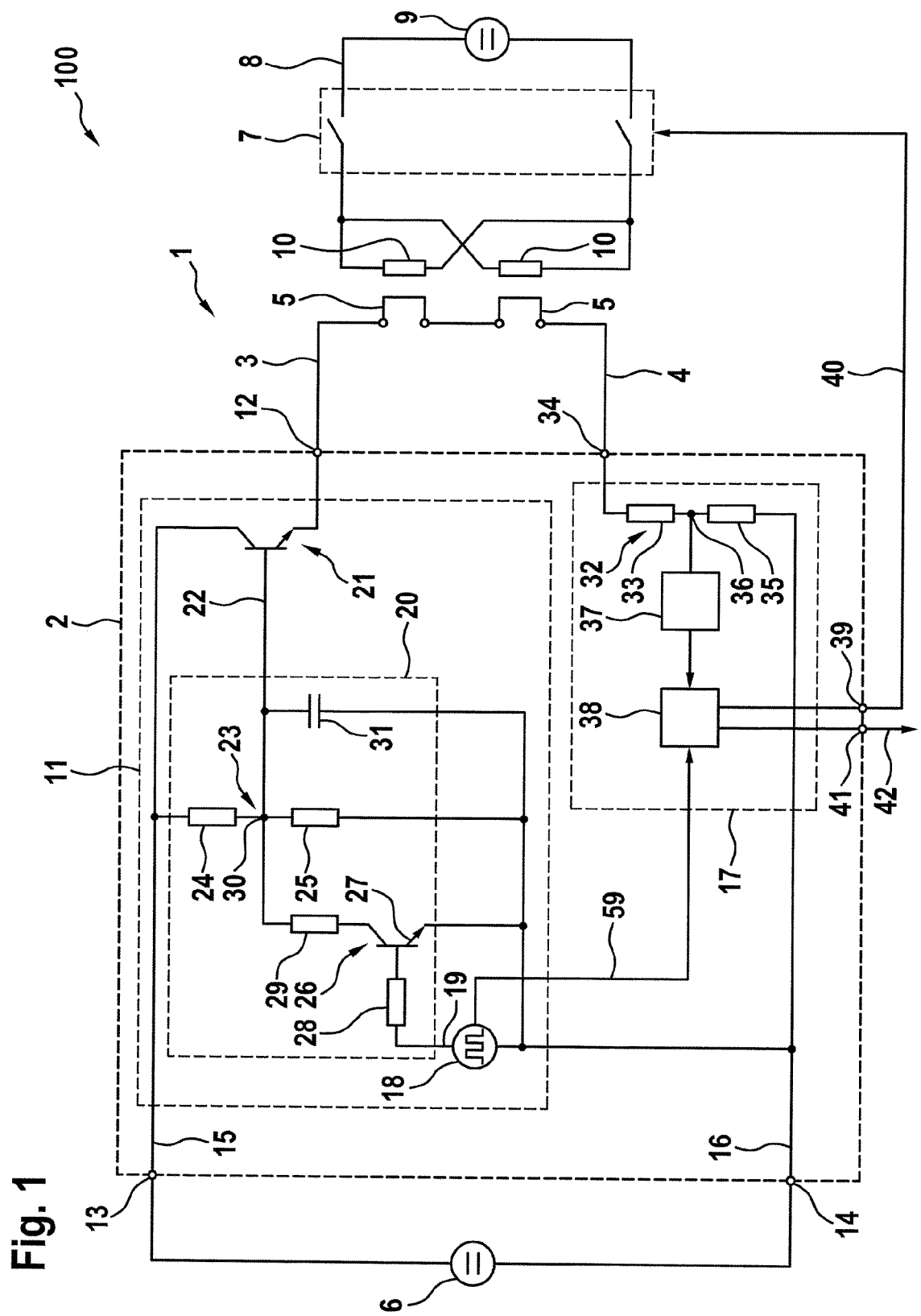

the reference potential is detectable on the second monitoring line (4), wherein the signal evaluation device (17) is configured for determining a fault on one of the monitoring lines (3, 4) which is caused by a fault voltage referenced to the reference potential, and/or a fault in the monitoring circuit (2) by means of a comparison of the voltage profile (43, 48 to 51) with a predetermined first tolerance interval (46) around the first monitoring voltage, and with a predetermined second tolerance interval (47) around the second monitoring voltage.

16 Claims, 4 Drawing Sheets

(56) References Cited

U.S. PATENT DOCUMENTS

| | | | | |
|---|---|---|---|---|
| 6,086,676 | A * | 7/2000 | Kao | C23C 14/54 |
| | | | | 700/121 |
| 6,604,014 | B1 * | 8/2003 | Barnett | G05B 9/02 |
| | | | | 324/513 |
| 8,571,738 | B1 * | 10/2013 | Potter | G01R 31/396 |
| | | | | 340/455 |
| 10,139,443 | B2 * | 11/2018 | Fouedjio | G07C 5/08 |
| 2007/0078042 | A1 * | 4/2007 | Yoneyama | F16H 61/12 |
| | | | | 477/125 |
| 2007/0291425 | A1 * | 12/2007 | Yugou | B60L 58/18 |
| | | | | 361/23 |
| 2009/0132062 | A1 * | 5/2009 | Jain | G05B 19/4148 |
| | | | | 700/282 |
| 2011/0311237 | A1 * | 12/2011 | Hotogi | G03G 15/80 |
| | | | | 399/9 |
| 2015/0219699 | A1 * | 8/2015 | Heller | G01R 31/52 |
| | | | | 324/511 |
| 2015/0224881 | A1 * | 8/2015 | Deyda | B60L 3/0015 |
| | | | | 701/29.2 |
| 2016/0001674 | A1 * | 1/2016 | Mikulec | B60L 50/51 |
| | | | | 307/77 |
| 2016/0124046 | A1 * | 5/2016 | Kang | B60L 3/0023 |
| | | | | 324/415 |
| 2016/0214485 | A1 * | 7/2016 | Butzmann | B60L 3/0046 |
| 2017/0292982 | A1 * | 10/2017 | Aceña | B60L 3/0069 |
| 2018/0356454 | A1 * | 12/2018 | Burkman | G01R 31/66 |
| 2020/0094682 | A1 * | 3/2020 | Zeng | G01R 31/54 |
| 2020/0218219 | A1 * | 7/2020 | Boudreau | G05B 19/0428 |
| 2022/0342004 | A1 * | 10/2022 | Werker | G01R 31/69 |

FOREIGN PATENT DOCUMENTS

| | | | |
|---|---|---|---|
| CN | 105313700 | A * | 2/2016 |
| CN | 107783525 | A | 3/2018 |
| DE | 10210665 | C1 | 6/2003 |
| DE | 102009012078 | A1 | 9/2010 |
| DE | 102010045990 | A1 | 3/2012 |
| DE | 102013219141 | A1 | 3/2015 |
| JP | S55-118174 | U | 8/1980 |
| JP | S56-22970 | A | 3/1981 |
| JP | 2013-173385 | A | 9/2013 |
| WO | 2017/056497 | A1 | 4/2017 |
| WO | 2018/030749 | A1 | 2/2018 |

OTHER PUBLICATIONS

International Search Report and Written Opinion issued in corresponding International Patent Application No. PCT/EP2019/082266, mailed on Feb. 21, 2020 (11 pages).

Office Action issued in counterpart Japanese Patent Application No. JP 2021-528888 A mailed Oct. 3, 2023 (4 pages).

* cited by examiner

MONITORING CIRCUIT FOR AN INTERLOCK SYSTEM, INTERLOCK SYSTEM, ASSEMBLY HAVING AN INTERLOCK SYSTEM AND HAVING A FUNCTIONAL UNIT, AND METHOD FOR OPERATING AN INTERLOCK SYSTEM

The present invention relates to a monitoring circuit for an interlock system, said interlock system comprising a first monitoring line, a second monitoring line, and at least one line bridge by means of which the monitoring lines are electrically conductively connected in a closed state of the interlock system, said monitoring circuit comprising a signal generation device which is configured for generating a monitoring signal for the first monitoring line which alternates between a first monitoring voltage and a second monitoring voltage and which is referenced to a reference potential, and a signal evaluation device by means of which a voltage profile which is referenced to the reference potential is detectable on the second monitoring line.

In addition, the present invention relates to an interlock system, an arrangement comprising an interlock system and a functional unit, and a method for operating an interlock system.

Interlock systems are used for detecting a fault in electrical networks, for example, a high-voltage network of a vehicle. Such a fault may be an undesired loosening of a plug connection or an unauthorized manual intervention, for example, an unauthorized opening of a protective cover, as a result of which live parts may be exposed. Typically, the electrical network is de-energized when such a fault is detected. For this purpose, the interlock system comprises monitoring lines connected by means of at least one line bridge, wherein a monitoring circuit is provided which detects the removal of a line bridge which, for example, is associated with the aforementioned plug connector.

The document DE 10 2010 045 990 A1 discloses a method for operating a motor vehicle comprising a high-voltage source for supplying components of a high-voltage vehicle electrical system with electrical power, in which a pulse width-modulated signal is applied to a signal loop which connects the components, wherein the presence of the signal is detected by at least one measuring device, and in the event that the signal is not present, the high-voltage source is disconnected from the high-voltage vehicle electrical system by means of at least one electrical disconnection means.

By using two monitoring voltages implemented by means of the pulse width-modulated signal, noise signals interspersed into the monitoring lines through induction can be distinguished from the pulse width-modulated signal. However, a more precise determination of the fault is possible only to a very limited extent.

The object of the present invention is therefore to specify an improved possibility for operating an interlock system for a vehicle.

To achieve this object, according to the present invention, in a monitoring circuit of the kind mentioned above, it is proposed that the signal evaluation device is configured for detecting a fault on one of the monitoring lines which is caused by a fault voltage referenced to the reference potential, and/or a fault in the monitoring circuit, by means of a comparison of the voltage profile with a predetermined first tolerance interval around the first monitoring voltage and with a predetermined second tolerance interval around the second monitoring voltage.

The present invention is based on the idea of defining two tolerance intervals in which the voltage profile on the second monitoring line is alternately in fault-free operation, such that faults such as short circuits to the fault voltage can be determined more accurately on the basis of a difference between the detected voltage profile and the voltage profile in fault-free operation. Alternatively or in addition, faults in the monitoring circuit itself, for example, so-called "stuck at" faults, can also be determined by means of the comparison on the basis of the tolerance intervals.

Typically, when a fault is detected, the signal evaluation device is configured to output a trigger signal, by means of which a disconnection device can be actuated, in order to disconnect a voltage source from a functional unit with which the line bridge is associated. The monitoring signal typically has a duty cycle of 50%. However, a duty cycle which deviates from this may also be provided. The signal evaluation device may furthermore be configured to output a piece of fault information which describes the determined fault in greater detail. This facilitates a fault diagnosis after the fault has been determined. The monitoring voltages typically do not form a limit of their respective tolerance interval. The tolerance intervals are advantageously selected in such a way that fluctuations in the voltage profile which are normal during operation and in particular do not indicate a fault, lie within the, or a, respective tolerance interval.

In particular potential differences with respect to the reference potential, which have a low internal resistance and may therefore be deemed to be a "hard" voltage, may be deemed to be a fault voltage. In other words, a fault voltage may be considered to be those voltages which have such a low internal resistance that the voltage profile assumes the value of the fault voltage if a short circuit to this voltage is present. The monitoring voltages are expediently selected in such a way that the signal evaluation device can readily distinguish the voltage profile generated by them from the fault voltage.

The tolerance intervals are expediently defined to be non-overlapping. In other words, between the tolerance intervals, there is a potential interval I in which the voltage profile does not lie for a longer period of time during fault-free operation of the interlock system. Alternatively or in addition, the tolerance intervals do not include voltage values provided for detecting the fault voltage.

On the basis of the tolerance intervals, for example, the following faults may be determined:

The signal evaluation device may be configured for determining the fault on the monitoring lines on the basis of a detected value of the voltage profile which does not lie between the tolerance intervals and which lies outside the tolerance intervals. It is thereby possible to conclude that there is a fault in the form of a short circuit having a potential which is applied inside or outside the interlock system, the potential difference of said potential with respect to the reference potential forming the fault voltage. For this purpose, the signal evaluation device may be configured to output a piece of fault information describing a short circuit.

The signal evaluation device may furthermore be configured for determining the fault on the monitoring lines on the basis of at least two successively detected values of the voltage profile lying between the tolerance intervals. It is also thereby possible to conclude that there is a short circuit having the previously described potential present inside or outside the interlock system. In this case, however, expediently, at least two successively detected values of the voltage profile are evaluated. The detection of only one value of the voltage profile lying between the tolerance intervals may be caused by the value having been detected during an alternation between the monitoring voltages, and the voltage profile having a finite edge steepness. If however, at least two successive values of the voltage profile are detected which lie between the tolerance intervals, it may be assumed, assuming a sufficiently large ratio of the edge steepness to a sampling interval, that the fault voltage is permanently present on one of the monitoring lines. In this case, the signal evaluation device may be configured to output the, or a, piece of fault information describing a short circuit.

The signal evaluation device may furthermore be configured for determining the fault on the monitoring circuit on the basis of a plurality of successively detected values of the voltage profile which are within a tolerance interval for, or longer than, a predetermined period. It is therefore possible to conclude that a "stuck at" fault exists if the successively detected values of the voltage profile no longer leave one of the tolerance intervals. The predetermined period is preferably selected by the signal generation device as a function of the intended period of generation of a respective monitoring voltage. The signal evaluation device may be configured to output a piece of fault information which describes a fault in the monitoring circuit.

According to one embodiment variant of the signal evaluation device, for comparing the voltage profile, said device comprises a plurality of comparators, the reference values of which correspond to limits of the tolerance intervals. According to an alternative embodiment variant, for comparing the voltage profile, the signal evaluation device comprises an analog-digital converter for converting the voltage profile into binary data. The signal evaluation device may comprise an evaluation unit which receives output signals of the comparators, or receives the binary data.

In the monitoring circuit according to the present invention, it may be provided that a piece of signal information describing a signal state of the monitoring signal may be transmitted from the signal generation device to the signal evaluation device, and the signal evaluation device is configured for detecting the fault on the basis of a comparison of a detected value of the voltage profile with the received signal state of the monitoring signal. When determining the fault, a comparison of a setpoint voltage profile described by the piece of signal information with the (actual) voltage profile described by the detected values may thus take place, assuming sufficiently small signal propagation times of the piece of signal information. As a result, the monitoring circuit may advantageously also be operated with an irregular sequence of first supply potentials and second supply potentials.

In the monitoring circuit according to the present invention, it may be provided that the signal generation device is configured to generate the monitoring signal from a supply voltage which is referenced to the reference potential and which has a first supply potential and a second supply potential.

In this respect, the supply voltage also constitutes a hard voltage. The monitoring voltages are expediently selected in such a way that the voltage profile generated by them is readily distinguishable from the supply potentials for the signal evaluation device. Expediently, the second supply voltage is the reference potential. The first supply potential is typically higher than the second potential.

It is particularly advantageous if the signal generation device is configured to generate the monitoring signal from the supply voltage in such a way that the monitoring voltages lie between the supply potentials. Typically, the second monitoring voltage lies between the first monitoring voltage and the second supply potential.

The signal evaluation device may be configured for determining the fault on the monitoring lines on the basis of a detected value of the voltage profile which does not lie between the tolerance intervals and which, on the part of the first supply potential, lies outside of the first tolerance interval. From this, it is possible to conclude that a fault exists in the form of a fault voltage due to a short circuit between one of the monitoring lines and the first supply potential. The signal evaluation device may be configured to output a piece of fault information describing a short circuit to the first supply potential.

Alternatively or in addition, the signal evaluation device may be configured for determining the fault on the monitoring lines on the basis of a detected value of the voltage profile which does not lie between the tolerance intervals and which, on the part of the second supply potential, lies outside the second tolerance interval. In this case, it may be concluded that a fault exists in the form of a fault voltage due to the second supply potential. The signal evaluation device may be configured to output a piece of fault information which describes a short circuit to the second supply potential or an interruption in the connection of the monitoring lines by the line bridge. In fact, the interruption in the monitoring lines is typically identified by the fact that the voltage profile is at the second supply potential. In this respect, a short circuit to the second supply potential cannot typically be distinguished from an interruption in the monitoring lines due to the removal of the line bridge.

Preferably, the signal generation device of the monitoring circuit according to the present invention comprises a generator unit which is configured for outputting a generator signal describing the alternation between the monitoring voltages, and a voltage conversion unit which is configured for converting the supply voltage as a function of the generator signal. It is thus possible to achieve a particularly compact, inexpensive, and low-effort implementation of the monitoring circuit if the generator unit and/or the analog-digital converter and/or an evaluation unit of the signal evaluation device are implemented by means of a common microcontroller.

The voltage conversion unit may comprise a voltage divider connected between the supply potentials, and a switching element which can be actuated by means of the generator signal and by means of which a resistance value of a branch of the voltage divider can be changed. This allows a low-cost circuit implementation of the signal generation device. Preferably, the switching element and a resistance element are connected in series, and in turn are connected in parallel with a resistance element of the branch, by means of which the resistance value can be changed.

In addition, the signal generation device may comprise an impedance converter which is configured to convert an output signal of the voltage conversion unit into the monitoring signal. The impedance converter makes it possible to use a high-impedance voltage converter in the voltage conversion unit, since the impedance converter drives the required current on the monitoring lines.

In the monitoring circuit according to the present invention, it is furthermore expediently provided that the signal evaluation device comprises a voltage divider, at the tap of which voltage profile signal representing a voltage profile is detectable. Particularly with respect to the use of the impedance converter, the voltage divider of the signal evaluation device may have a low resistance in comparison to the resistance values of the voltage divider of the signal generation device. By means of the voltage divider, the voltage profile signals may also be adjusted to a detection range of the analog-digital converter.

The signal evaluation device may also comprise a resistance element which is connected between an input to the second monitoring line and the second supply potential, and which has a low resistance compared to the sum of the resistance values of the voltage divider. As a result, a potential at the signal evaluation device may be defined and quickly brought to a predetermined value outside the tolerance intervals, if the first monitoring line and the second monitoring line are interrupted. Alternatively, the signal evaluation device may comprise a current sink which makes it possible to maintain the current on the monitoring lines.

In addition, the present invention relates to an interlock system for a vehicle, comprising a first monitoring line, a second monitoring line, and at least one line bridge by means of which the monitoring lines are electrically conductively connected in a closed state of the interlock system, as well as a monitoring circuit according to the present invention, wherein the signal generation device is connected to the first monitoring line, and the signal evaluation device is connected to the second monitoring line.

In particular, the interlock system comprises at least one further line bridge. The line bridges may be connected in series between the first and second monitoring lines. Alternatively, the monitoring circuit may comprise a further corresponding signal evaluation unit for each further line bridge.

The present invention furthermore relates to an arrangement comprising an interlock system according to the present invention and comprising a functional unit which can be monitored by means of the line bridge or the line bridges, and which is configured to provide a voltage which is referenced to the reference potential as a fault voltage during its operation, wherein the voltage is outside the tolerance intervals. The functional unit may, for example, be an inverter for a vehicle. The, or a, line bridge are arranged in particular in such a way that they disconnect the monitoring lines when a cover covering live parts of the functional unit is opened, or when a plug connector is removed.

The arrangement may also comprise a disconnection device, which can be actuated by means of a trigger signal which is output in the event of a determined fault, for disconnecting a high-voltage battery from the functional unit.

In addition, the present invention relates to a method for operating an interlock system, which comprises a first monitoring line, a second monitoring line, and at least one line bridge by means of which the monitoring lines are electrically conductively connected in a closed state of the interlock system, comprising the following steps:

generating a monitoring signal for the first monitoring line which alternates between a first monitoring voltage and a second monitoring voltage and which is referenced to a reference potential, detecting a voltage profile on the second monitoring line which is referenced to the reference potential, determining a fault on one of the monitoring lines caused by a fault voltage referenced to the reference potential, and/or a fault in the monitoring circuit, by means of a comparison of the voltage profile with a predetermined first tolerance interval around the first monitoring voltage, and with a predetermined second tolerance interval around the second monitoring voltage.

All embodiments of the monitoring circuit according to the present invention may be transferred in an analogous manner to the interlock system according to the present invention, the arrangement according to the present invention, and the method according to the present invention, so that the aforementioned advantages can also be achieved with these.

Figure 2:
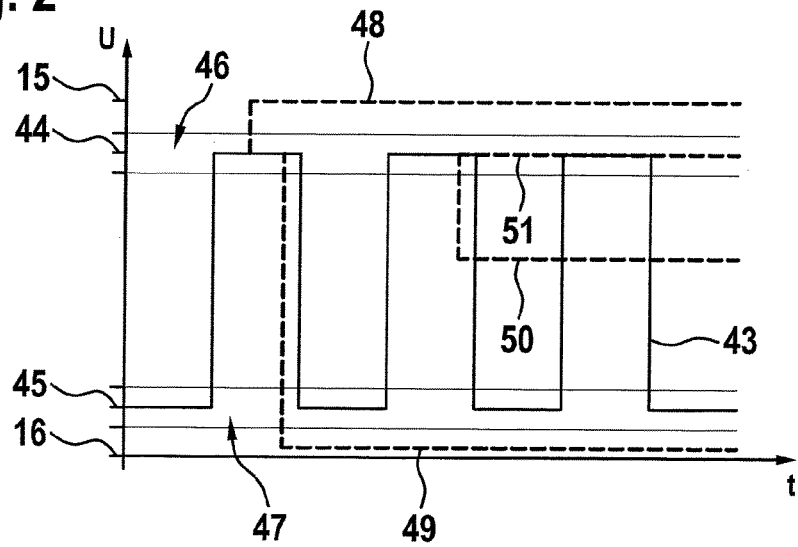
Figure 3:
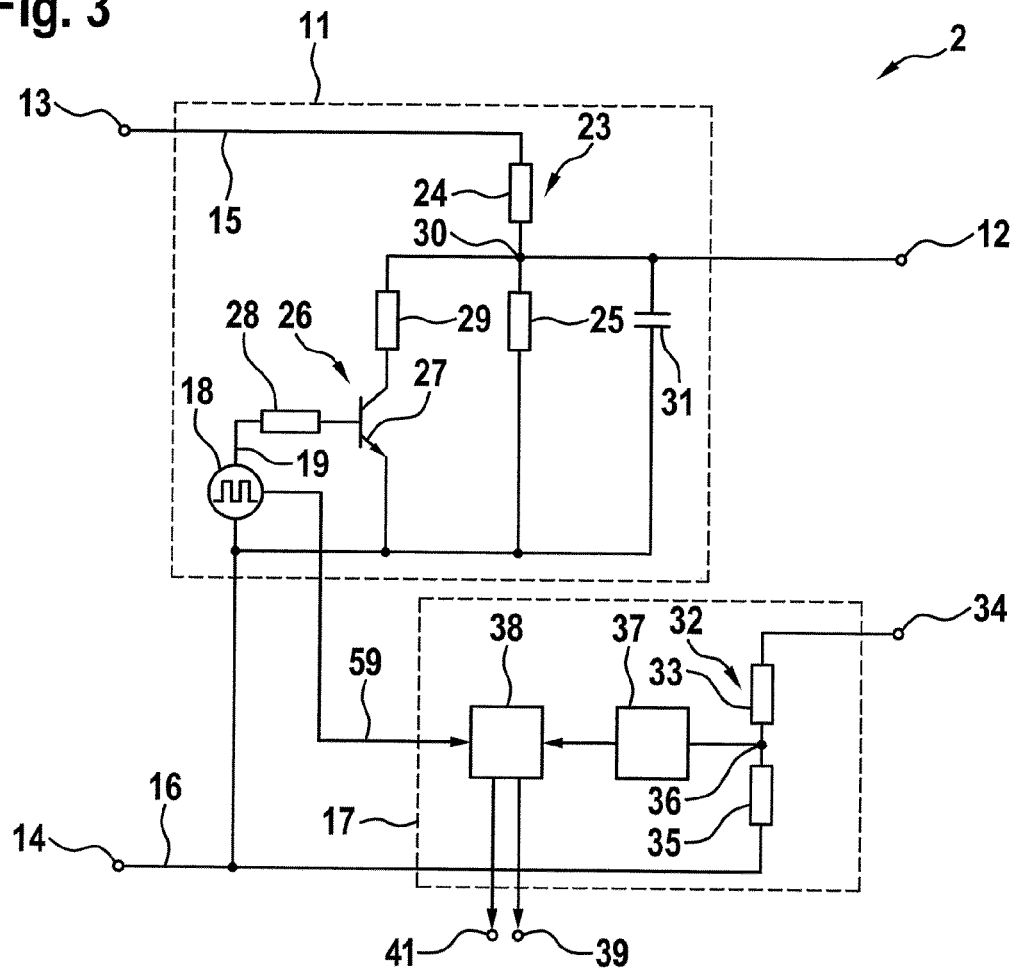
Figure 3A:
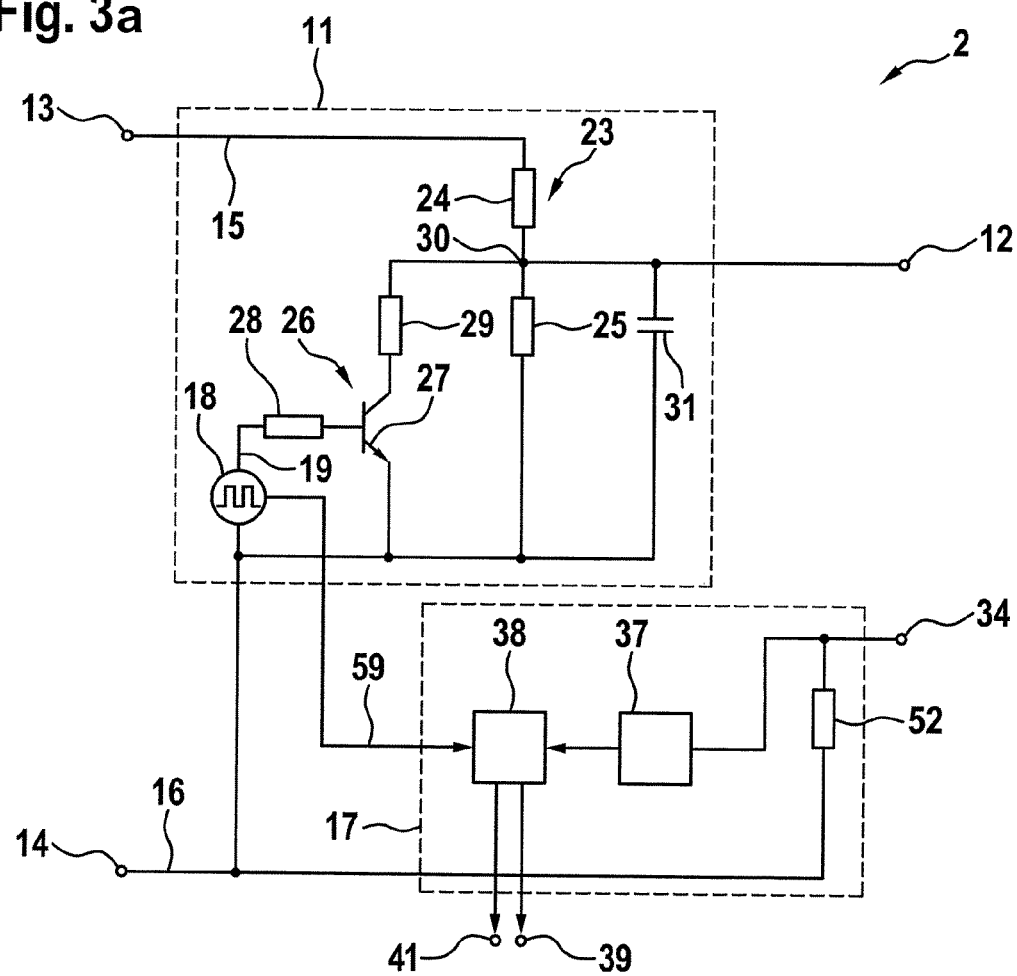
Figure 4:
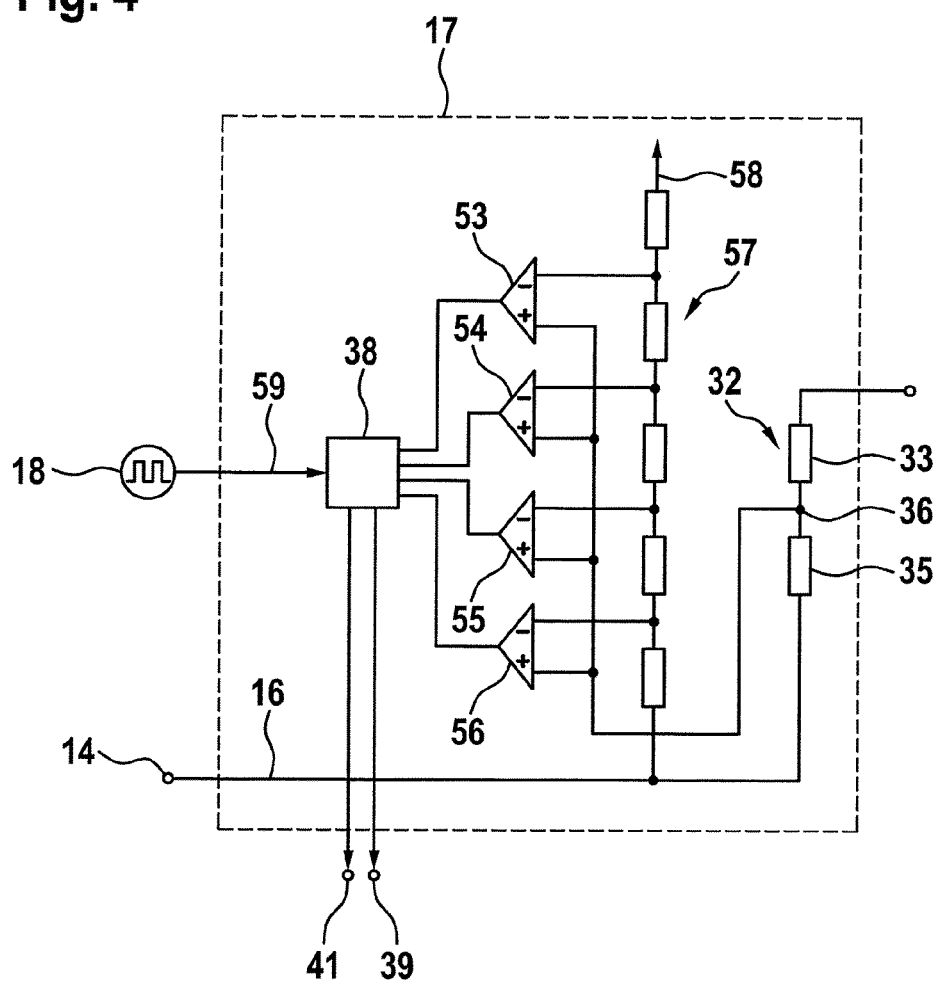

Further advantages and details of the present invention will become apparent from the exemplary embodiments described below, and with reference to the drawings. Said drawings are schematic representations and depict:

FIG. 1: a circuit diagram of an exemplary embodiment of the arrangement according to the present invention, comprising an exemplary embodiment of the interlock system according to the present invention, said interlock system comprising an exemplary embodiment of the monitoring circuit according to the present invention;

FIG. 2: voltage profiles over time during operation of the interlock system depicted in FIG. 1;

FIGS. 3 and 3a: respectively, a circuit diagram of a further exemplary embodiment of the monitoring circuit according to the present invention;

FIG. 4: a circuit diagram of a signal evaluation device of a further exemplary embodiment of the monitoring circuit according to the present invention.

FIG. 1 depicts a circuit diagram of an exemplary embodiment of an arrangement 100, comprising an interlock system 1 which comprises an exemplary embodiment of a monitoring circuit 2, and comprising two functional units 10.

The interlock system 1 comprises a first monitoring line 3, a second monitoring line 4, two line bridges 5 by means of which the monitoring lines 3, 4 are electrically conductively connected in a closed state of the interlock system 1, and a DC voltage source 6. In the present exemplary embodiment, the interlock system 1 is used in a high-voltage electrical system 8 of a vehicle. The arrangement 100 furthermore comprises a high-voltage battery 9 of the high-voltage vehicle electrical system 8, and a disconnection device 7 by means of which the high-voltage battery 9 can be disconnected from the functional units 10.

One of the line bridges 5 is associated with each of the functional units 10. Alternatively, the line bridges 5 are associated with a single functional unit 10. By way of example, one line bridge 5 is associated with a plug of the functional unit 10, and one line bridge 5 is associated with a cover of a device housing of the functional unit 10. An example of a functional unit 10 is an inverter for converting a voltage provided by the high-voltage battery 9 into an AC voltage for an electric machine (not depicted) for driving a vehicle (not depicted). The association may be implemented in that the line bridge 5 disconnects the monitoring lines 3, 4 when the cover is opened or when the plug is removed. Since the disconnection device 7 and the high-voltage battery 9 are arranged in a common battery housing which is separate from the device housing, the interlock system 1 may be understood to be a local interlock system with respect to the functional units 10 or the functional unit 10.

The monitoring circuit 2 comprises a signal generation device 11 which is configured for generating a monitoring signal for the first monitoring line 3 which alternates between a first monitoring voltage and a second monitoring voltage. For this purpose, the first monitoring line 3 is directly connected to an output 12 of the monitoring circuit 2. The signal generation device 11 is configured to generate the monitoring signal from a supply voltage provided by the DC voltage source 6 at supply terminals 13, 14 of the monitoring circuit 2. The supply voltage comprises a first supply potential 15 and a lower, second supply potential 16 which is a ground potential of the vehicle and/or a housing potential of the housing, and in this respect, is selected as a reference potential. The monitoring signal is generated in such a way that the monitoring voltages lie between the supply potentials 15, 16, wherein the first monitoring voltage lies above the second monitoring voltage.

The monitoring circuit 2 furthermore comprises a signal evaluation device 17, by means of which a voltage profile referenced to the reference potential is detectable on the second monitoring line 4, and which is configured for determining an interruption of the monitoring lines 3, 4, a fault on one of the monitoring lines 3, 4 caused by a fault voltage referenced to the supply voltage, and a fault in the monitoring circuit 2, on the basis of the voltage profile, as will be described below in greater detail.

In detail, the signal generation device 11 comprises a generator unit 18 which is configured for outputting a generator signal 19 describing the alternations between the monitoring voltages, and a voltage conversion unit which is configured for converting the monitoring voltages as a function of the generator signal 19. In addition, the signal generation device 11 comprises an impedance converter 21 which is configured for generating the monitoring signal as a function of an output signal 22 of the voltage conversion unit 20.

The generator signal 19 describes a clocked alternation between the monitoring voltages, which, in the present case, has a duty cycle, for example, of 50%. The voltage conversion unit 20 comprises a voltage divider 23 connected between the supply potentials 15, 16, and comprising a first resistance element 24 at the first supply potential 15 and a second resistance element 25 at the second supply potential 16. In addition, the voltage conversion unit 20 comprises a switching element 26 which can be actuated by the generator signal 19, and which, in the present case, is implemented by means of a transistor 27 with a series resistor 28 at its base terminal. A third resistance element 29 is connected in series with the switching element 26, wherein the switching element 26 and the third resistance element 29 are connected in parallel with the second resistance element 25. As a result, the resistance value of the branch of the voltage divider 23 comprising the second resistance element 25 and the third resistance element 29 is variable as a function of the generator signal 19. If the generator unit 18 actuates the switching element 26 for blocking, an output signal 22 is applied to a tap of the voltage divider 23, which causes the first monitoring voltage to be provided at the output 12. If the generator signal 19 actuates the switching element 26 for conducting, then, due to the parallel connection of the second resistance element 25 with the third resistance element 29 at the tap 30, an output signal 22 results which causes the second monitoring voltage to be provided at the output 12. In addition, the voltage conversion unit 20 comprises a capacitor 31 which is connected between the tap 30 and the second supply potential 16, in order to dampen overshoots when alternating between the monitoring voltages and to set an edge steepness when alternating between the monitoring voltages.

The output signal 22 of the voltage conversion unit 20 is fed to the impedance converter 21. Said impedance converter provides the first monitoring voltage and the second monitoring voltage at the output 12.

The signal evaluation device 17 comprises a voltage divider 32, the first resistance element 33 of which is connected to an input 34 of the monitoring circuit 2, the second monitoring line 4 also being connected to said input. A second resistance element 35 of the voltage divider 32 is connected to the second supply potential 16. A voltage profile signal which describes the voltage profile in scaled form can thus be tapped at a tap 36 of the voltage divider 32. Since the impedance converter 21 can drive a sufficiently high current through the monitoring lines 3, 4, the voltage divider 32 of the signal evaluation device 17 is selected to have a relatively low resistance compared to the voltage divider of the signal conversion unit 20. The impedance converter 21 therefore makes it possible that the voltage dividers 23, 32 do not have to be matched to one another, since said impedance converter largely rules out the possibility of the signal generation device 11 being influenced by the signal evaluation device 17.

The signal evaluation device 17 furthermore comprises an analog-digital converter 37 which converts the voltage profile scaled by the divider 32 into binary data. These binary data can be provided to an evaluation unit 38 of the signal evaluation device 17, which detects the faults on the monitoring lines 3, 4 and the faults in the monitoring circuit 2 by evaluating the voltage profile described by the binary data, and provides a trigger signal 40 at an output 39 of the monitoring circuit 2, and a piece of fault information 42 at an output 41 of the monitoring circuit 2.

The interlock system 1 enables detection of a disconnection of the monitoring lines 3, 4 as a result of a removal of one of the line bridges 5. In this case, the monitoring signal no longer reaches the input 34 of the monitoring circuit 2, with the result that the voltage profile is at the second supply potential 16, whereupon the evaluation unit 38 outputs the trigger signal 40. By means of the trigger signal 40, the disconnection device 7 is actuated for disconnecting the high-voltage battery 9 from the functional units 10, since, as a result of the interruption of the monitoring lines 3, 4, it is expected that a live part is exposed on the functional units 10, and there is a risk of a person coming in contact with it.

The determination of faults by means of the monitoring circuit 2 will be described in detail below with reference to FIG. 2, which depicts profiles of a voltage U over time t.

FIG. 2 depicts a voltage profile 43, which is indicated by a solid line and which is referenced to the second supply potential 16 as applied to the input 34 and detected by the signal evaluation unit 17. The voltage profile 43 alternates between a voltage 44 which corresponds to the first monitoring voltage and a voltage which corresponds to the second monitoring voltage. A first tolerance interval 46 is defined around the first monitoring voltage, and a second tolerance interval 47 is defined around the second monitoring voltage. The tolerance intervals 46, 47 are non-overlapping and do not comprise any fault voltages in the form of the supply potentials 15, 16 or any other hard voltage which is common in the functional units 10. In the specific example according to FIG. 2, the monitoring voltages or the voltages 44, 45 are in the center of the tolerance intervals 46, 47.

The analog-digital converter 37 samples the voltage profile 43 scaled by means of the voltage divider 32 considerably more frequently than required by the Nyquist criterion. On the basis of samples lying periodically within the tolerance intervals 46, 47, the evaluation unit 38 detects that the monitoring lines 3, 4 are connected by means of the line bridges 5, with the result that the output of the trigger signal 40 does not occur. Since the infinite edge steepnesses of the voltage profile 43 schematically depicted in FIG. 2 are not achievable in practical applications, fault-free operation is also determined by the evaluation unit 38 if a sample acquired during the alternation of the monitoring voltages lies between the tolerance intervals 46, 47, and the alternation between the monitoring voltages is short compared to the sampling interval.

Possible faults which can be identified by means of the monitoring circuit 2 will be explained below with reference to dashed voltage profiles 48 to 51, which describe voltage profiles which deviate from the voltage profile 43:

The voltage profile 48 differs from the voltage profile 43 in that, as of a certain point in time, it lies outside the first tolerance interval 46, at the first supply potential 15. This typically indicates a short circuit between one of the monitoring lines 3, 4 and a part carrying the first supply potential 15. On the basis of the first acquisition of a sample which lies above the first tolerance interval 46, the evaluation unit 38 determines that a fault exists which is caused by the first supply potential being a fault voltage, and outputs the trigger signal 40. In addition, the evaluation unit outputs a piece of fault information 42 which describes the existence of a short circuit between one of the monitoring lines 3, 4 and the first supply potential 15.

The voltage profile 49 differs from the voltage profile 43 in that, as of a certain point in time, it lies outside the second tolerance interval 47 with respect to the second supply potential 16. This indicates that there is a short circuit between one of the monitoring lines 3, 4 and the second supply potential 16, or that one of the line bridges 5 no longer connects the monitoring lines 3, 4 with one another. As of the first acquisition of such a sample by means of the evaluation unit 38, said evaluation unit outputs the trigger signal 40 and a piece of fault information 42 which describes that there is a short circuit between one of the monitoring lines 3, 4 and the second supply potential 16, or that the line bridges 5 have been removed.

The voltage profile 50 differs from the voltage profile 43 in that it lies between the tolerance intervals 46, 47 as of a certain point in time. This indicates a short circuit between one of the monitoring lines 3, 4 and a fault voltage lying between the supply potentials 15, 16. However, since a single sample lying between the tolerance intervals 46, 47 only indicates sampling during the alternation of the monitoring voltages, the evaluation unit 38 outputs the trigger signal 40 only after the acquisition of two successive samples lying between the tolerance intervals 46, 47. Simultaneously, said evaluation unit outputs a piece of fault information which describes the existence of a short circuit between one of the monitoring lines 3, 4 and a fault voltage lying between the supply potentials 15, 16. This fault voltage is, for example, the voltage generated or present inside the housing during the operation of the functional unit 10.

The voltage profile 51 differs from the voltage profile 43 in that, as of a certain point in time, it does not complete an alternation between the tolerance intervals 46, 47, and therefore remains in one of the tolerance intervals 46, 47, in the present case, the first tolerance interval 46. This indicates a fault in the signal generation device 11 and/or the signal evaluation device 17, in particular its analog-digital converter 37. One such fault, for example, is a so-called "stuck at" fault. If the evaluation unit 38 detects a fault in the monitoring circuit 2 on the basis of a plurality of successively acquired samples which lie within one of the tolerance intervals 46, 47 for a predetermined period or longer, said evaluation unit outputs the trigger signal and a piece of fault information 42 describing a fault in the monitoring circuit 2.

FIG. 3 is a circuit diagram of a further exemplary embodiment of a monitoring circuit 2, which corresponds to the one depicted in FIG. 1, except for the deviations described below. Identical or similarly acting components are provided with identical reference symbols.

The signal generation device 11 does not have an impedance converter. Instead, the tap 30 of the voltage divider 23 is connected directly to the output 12. The voltage divider 23 has a low resistance in comparison to the voltage divider 32 of the signal evaluation device 17; thus, it is able to drive a current along the monitoring lines 3, 4 itself. In this respect, in the exemplary embodiment according to FIG. 3, the impedance converter 21 (see FIG. 1) is dispensed with. The voltage divider 32 adjusts the voltage range of the signal at the input 34 to the input voltage range of the analog-digital converter 37. In addition, the voltage divider 32 ensures that in the event of a disconnection of the monitoring lines 3, 4, the measured voltage drops appropriately rapidly.

FIG. 3a depicts a further exemplary embodiment of the circuit depicted in FIG. 3. Here, the voltage range of the signal at the input 34 is already in the input voltage range of the analog-digital converter 37. Instead of the voltage divider 32, a resistance element 52 is sufficient here, which enables a defined and rapid drop in the voltage at the input 34 in the event of a disconnection of the monitoring lines 3, 4.

FIG. 4 depicts a signal evaluation device 17 according to a further exemplary embodiment of a monitoring circuit, which corresponds to one of the previously described exemplary embodiments, except for the deviations described below. Identical or similarly acting components are provided with identical reference symbols.

The signal evaluation device 17 comprises four comparators 53 to 56, the outputs of which are connected to the evaluation unit 38. The positive inputs of the comparators 53 to 56 are connected to the tap 36 of the voltage divider 32. In addition, the signal evaluation device 17 comprises a series connection 57 of a plurality resistance elements between a further potential 58 and the second supply potential 16. Taps between a respective pair of adjacent resistance elements of the series connection 57 are connected to the negative inputs of the comparators 53 to 56, and provide reference voltages which correspond to the limits of the tolerance intervals 46, 47 depicted in FIG. 2. The evaluation unit 38 may accordingly determine the previously described faults on the basis of the output signals of the comparators 53 to 56, analogously to the evaluation carried out with respect to FIG. 2.

According to a further exemplary embodiment which corresponds to the exemplary embodiment depicted in FIG. 4, the signal evaluation device 17 may also comprise a resistance element 52 instead of the voltage divider 32 according to FIG. 3 or 3a.

According to a further exemplary embodiment which corresponds to one of those previously described, a piece of signal information 59 describing a signal state of the monitoring signal (see FIGS. 1, 3, and 4) is transmittable from the signal generation device 11 to the signal evaluation device 17, as depicted by a connection between the generator unit 18 and the evaluation unit 38. The signal evaluation device 17 is furthermore configured for detecting the fault on the basis of a comparison of a detected value of the voltage profile 48 to 51 with the received signal state of the monitoring signal. By means of the piece of signal information 59, the points in time at which an alternation between the monitoring voltages takes place are known to the evaluation unit 38, so that irregular alternations between the monitoring voltages can also be provided, and/or in the case of the voltage profiles 50, 51, the corresponding fault can be determined with just one sample, taking into consideration sufficiently short signal propagation times of the piece of signal information 59.

In the exemplary embodiments according to FIGS. 1 and 3, the generator unit 18, the evaluation unit 38, and the analog-digital converter 37 are implemented by means of a microcontroller. In the exemplary embodiment according to FIG. 4, the generator unit 18 and the evaluation unit 38 are implemented by means of a microcontroller.

The interlock system 1 depicted in FIG. 1 comprises a current loop formed by the line bridges 5, the interruption of which is monitored by the monitoring circuit 2. In an alternative exemplary embodiment of the interlock system 1, said system comprises separate current loops for a respective line bridge 5, which are respectively monitored separately by the monitoring circuit 2 or by a monitoring circuit 2 comprising a plurality of signal evaluation devices 17.

In a further exemplary embodiment, which otherwise corresponds to the ones previously described, the interlock system is not a local interlock system, but rather a central interlock system. Here, the monitoring circuit 2 is arranged with the disconnection device 7 in the battery housing.

The invention claimed is:

1. A monitoring circuit for an interlock system, said interlock system comprising a first monitoring line, a second monitoring line, and at least one line bridge, by which the monitoring lines are electrically conductively connected in a closed state of the interlock system, said monitoring circuit comprising:
   a signal generation device which is configured for generating a monitoring signal for the first monitoring line which alternates between a first monitoring voltage and a second monitoring voltage and which is referenced to a reference potential; and
   a signal evaluation device by which a voltage profile which is referenced to the reference potential is detectable on the second monitoring line, wherein the signal evaluation device is configured for determining a fault on one of the monitoring lines which is caused by a fault voltage referenced to the reference potential by a comparison of the voltage profile with a predetermined first tolerance interval, the first monitoring voltage belonging to the predetermined first tolerance interval, and with a predetermined second tolerance interval, the second monitoring voltage belonging to the predetermined second tolerance interval.

2. The monitoring circuit as claimed in claim 1, wherein the tolerance intervals are defined to be non-overlapping, and/or do not include voltage values provided for detecting the fault voltage.

3. The monitoring circuit as claimed in claim 1, wherein the signal evaluation device is configured for determining the fault on the monitoring lines based on a value of the detected voltage profile which does not lie between the tolerance intervals and which lies outside the tolerance intervals.

4. The monitoring circuit as claimed in claim 1, wherein the signal evaluation device is configured for determining the fault on the monitoring lines based on at least two successively detected values of the voltage profile lying between the tolerance intervals.

5. The monitoring circuit as claimed in claim 1, wherein the signal evaluation device is configured for determining the fault in the monitoring circuit based on a plurality of successively detected values of the voltage profile which lie within a tolerance interval for, or longer than, a predetermined period.

6. The monitoring circuit as claimed in claim 1, wherein the signal evaluation device comprises a plurality of comparators, reference values of which correspond to limits of the tolerance intervals, for comparing the voltage profile, or an analog-digital converter for converting the voltage profile into binary data.

7. The monitoring circuit as claimed in claim 1, wherein a signal information describing a signal state of the monitoring signal is transmittable from the signal generation device to the signal evaluation device, and the signal evaluation device is configured for detecting the fault based on a comparison of a detected value of the voltage profile with a received signal state of the monitoring signal.

8. The monitoring circuit as claimed in claim 1, wherein the signal generation device is configured to generate the monitoring signal from a supply voltage which is referenced to the reference potential and which has a first supply potential and a second supply potential.

9. The monitoring circuit as claimed in claim 8, wherein the signal generation device is configured to generate the monitoring signal from the supply voltage in such a way that the monitoring voltages lie between the supply potentials.

10. The monitoring circuit as claimed in claim 8, wherein the signal generation device comprises a generator unit which is configured for outputting a generator signal describing the alternations between the monitoring voltages, and a voltage conversion unit which is configured for converting the supply voltage as a function of the generator signal.

11. The monitoring circuit as claimed in claim 10, wherein the voltage conversion unit comprises a voltage divider connected between the supply potentials, and a switching element which can be actuated by means of the generator signal and by which a resistance value of a branch of the voltage divider can be changed.

12. The monitoring circuit as claimed in claim 10, wherein the signal generation device comprises an impedance converter which is configured for converting an output of the voltage conversion unit into the monitoring signal.

13. The monitoring circuit as claimed in claim 1, wherein the signal evaluation device comprises a voltage divider, at a tap of which the voltage profile is detectable.

14. An interlock system, comprising:
   a first monitoring line;
   a second monitoring line;
   at least one line bridge by which the monitoring lines are electrically conductively connected in a closed state of the interlock system; and
   a monitoring circuit as claimed in claim 1, wherein the signal generation device is connected to the first monitoring line and the signal evaluation device is connected to the second monitoring line.

15. An arrangement comprising:
   an interlock system as claimed in claim 14; and
   a functional unit which is monitored by the line bridge and which is configured to provide a voltage referenced to the reference potential as a fault voltage during its operation, wherein the voltage is outside the tolerance intervals.

16. A method for operating an interlock system, which comprises a first monitoring line, a second monitoring line, and at least one line bridge by which the monitoring lines are electrically conductively connected in a closed state of the interlock system, the method comprising:
   generating a monitoring signal, by a signal generation device comprising a generator unit and a voltage conversion unit, for the first monitoring line which alternates between a first monitoring voltage and a second monitoring voltage and which is referenced to a reference potential;

detecting a voltage profile on the second monitoring line which is referenced to the reference potential;

determining a fault on one of the monitoring lines caused by a fault voltage referenced to the reference potential by a comparison of the voltage profile with a predetermined first tolerance interval, the first monitoring voltage belonging to the predetermined first tolerance interval, and with a predetermined second tolerance interval, the second monitoring voltage belonging to the predetermined second tolerance interval.

* * * * *